US012765155B2

(12) United States Patent
Okuda et al.

(10) Patent No.: US 12,765,155 B2
(45) Date of Patent: Oct. 13, 2026

(54) TANDEM SOLAR CELL

(71) Applicant: TOYOTA JIDOSHA KABUSHIKI KAISHA, Toyota (JP)

(72) Inventors: Yuya Okuda, Nisshin (JP); Shinya Iwasaki, Mizuho (JP); Shoichi Iwamoto, Fuji (JP); Ryota Morikawa, Osaka (JP); Ryuzo Tagami, Toyota (JP); Shintaro Hinata, Toyota (JP); Hiroki Ushio, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 19/274,790

(22) Filed: Jul. 21, 2025

(65) Prior Publication Data

US 2026/0082759 A1 Mar. 19, 2026

(30) Foreign Application Priority Data

Sep. 19, 2024 (JP) ................................ 2024-161769

(51) Int. Cl.

| | |
|---|---|
| ***H10K 39/15*** | (2026.01) |
| ***G02B 5/20*** | (2006.01) |
| ***H02S 20/30*** | (2014.01) |
| ***H10F 10/19*** | (2025.01) |
| ***H10K 30/57*** | (2023.01) |
| ***H10K 85/50*** | (2023.01) |
| *B60R 16/03* | (2006.01) |

(52) U.S. Cl.

CPC ............. *H10K 39/15* (2023.02); *H02S 20/30* (2014.12); *H10F 10/19* (2025.01); *H10K 30/57* (2023.02); *H10K 85/50* (2023.02); *B60R 16/03* (2013.01); *G02B 5/20* (2013.01)

(58) Field of Classification Search

CPC ........ H10K 39/15; H10K 30/57; H10K 85/50; H02S 20/30; G02B 5/20; H10F 10/19

See application file for complete search history.

(56) References Cited

U.S. PATENT DOCUMENTS

| | | | | |
|---|---|---|---|---|
| 2017/0155358 A1* | 6/2017 | Uzu | ........................ | H10K 85/50 |
| 2018/0158976 A1 | 6/2018 | Ahn | | |
| 2023/0110770 A1* | 4/2023 | Huang | ................ | B23K 26/362 438/57 |
| 2024/0341107 A1* | 10/2024 | Wu | ........................ | H10K 30/40 |

FOREIGN PATENT DOCUMENTS

| | | | | |
|---|---|---|---|---|
| CN | 113424324 A * | 9/2021 | ........... | H10F 77/247 |
| JP | 2018-093168 A | 6/2018 | | |

OTHER PUBLICATIONS

English Machine Translation of CN113424324A (Year: 2021).*

* cited by examiner

*Primary Examiner* — Kourtney R S Carlson
(74) *Attorney, Agent, or Firm* — Oliff PLC

(57) ABSTRACT

Provided is a tandem solar cell capable of suppressing uneven power generation among silicon devices disposed on a lower side of perovskite devices. The tandem solar cell includes a plurality of perovskite devices disposed on a front surface side of a plurality of silicon devices, at least part of the plurality of silicon devices being disposed on a back surface side of a gap between the perovskite devices or light passing through the gap between the perovskite devices from the front surface side to the back surface side reaching the at least part of the plurality of silicon devices, in which a translucent filter that blocks light in a wavelength band absorbed in the perovskite devices is provided in the gap between the perovskite devices.

2 Claims, 5 Drawing Sheets

TANDEM SOLAR CELL

CROSS REFERENCE TO RELATED APPLICATIONS

The present application claims priority from Japanese patent application JP 2024-161769 filed on Sep. 19, 2024, the entire content of which is hereby incorporated by reference into this application.

BACKGROUND

Technical Field

The present disclosure relates to a tandem solar cell.

Background Art

JP 2018-093168 A discloses a tandem solar cell having a perovskite solar cell stacked on and bonded to a silicon solar cell. In the tandem solar cell, the perovskite solar cell including an absorption layer having a relatively large band gap and the silicon solar cell including an absorption layer having a relatively small band gap are bonded via a bonding layer, and by having light in a short wavelength band be absorbed in the perovskite solar cell disposed on an upper side to generate electric power and light in a long wavelength band be absorbed in the silicon solar cell disposed on a lower side to generate electric power, a threshold wavelength can be shifted to the long wavelength, resultantly widening the wavelength band for absorption by the entire solar cell (the entire wavelength band for absorption can be widely used). Thus, light energy in a wide spectral range can be efficiently used.

SUMMARY

The silicon solar cell has a standardized cell size and is less flexible in size (area). Meanwhile, in the perovskite solar cell, the cell area can be made larger depending on a manufacturer's intention. The cell having a larger area has a higher area efficiency for receiving light such as sunlight and is thus preferred, if available. This could cause a difference in cell size between the silicon solar cell and the perovskite solar cell. When the silicon solar cell and the perovskite solar cell having different cell sizes are used in tandem, the numbers and positions of the upper and lower solar cells that can be disposed (specifically, silicon devices forming a bottom cell and perovskite devices forming a top cell) differ, which could cause the silicon devices to be partially or entirely disposed on a lower side of the gaps between the perovskite devices.

When the silicon solar cell and the perovskite solar cell are used in tandem, light remaining after part of light energy is absorbed in the perovskite solar cell reaches the silicon devices forming the bottom cell, and the silicon devices generate electric power using the remaining light. Meanwhile, in the gaps between the perovskite devices, the light energy is not absorbed in the perovskite solar cell and thus directly reaches the silicon devices. When intense light that passes through the gaps between the perovskite devices without penetrating the perovskite devices reaches the silicon devices disposed on the lower side of the gaps between the perovskite devices, heat generation due to non-uniform electric power generation (occurrence of uneven power generation) among the silicon devices is concerned. Because of the temperature characteristics of the solar cell, when the temperature rises due to heat generation, the power generation efficiency of the solar cell decreases.

The present disclosure has been made in view of the foregoing and provides a tandem solar cell capable of suppressing uneven power generation among silicon devices disposed on a lower side of perovskite devices.

To solve the foregoing, a tandem solar cell according to the present disclosure is a tandem solar cell including a plurality of perovskite devices disposed on a front surface side of a plurality of silicon devices, at least part of the plurality of silicon devices being disposed on a back surface side of a gap between the perovskite devices or light passing through the gap between the perovskite devices from the front surface side to the back surface side reaching the at least part of the plurality of silicon devices, in which a translucent filter that blocks light in a wavelength band absorbed in the perovskite devices is provided in the gap between the perovskite devices.

According to the present disclosure, uneven power generation among silicon devices disposed on a lower side of perovskite devices can be suppressed by providing a translucent filter that blocks light in a wavelength band absorbed in the perovskite devices in a gap between the perovskite devices.

DETAILED DESCRIPTION

Hereinafter, an embodiment of the present disclosure will be described in detail with reference to the drawings of FIG. 1 to FIG. 5. Note that the embodiment shown below is one aspect of the present disclosure and does not limit the technical scope of the present disclosure.

Figure 1:
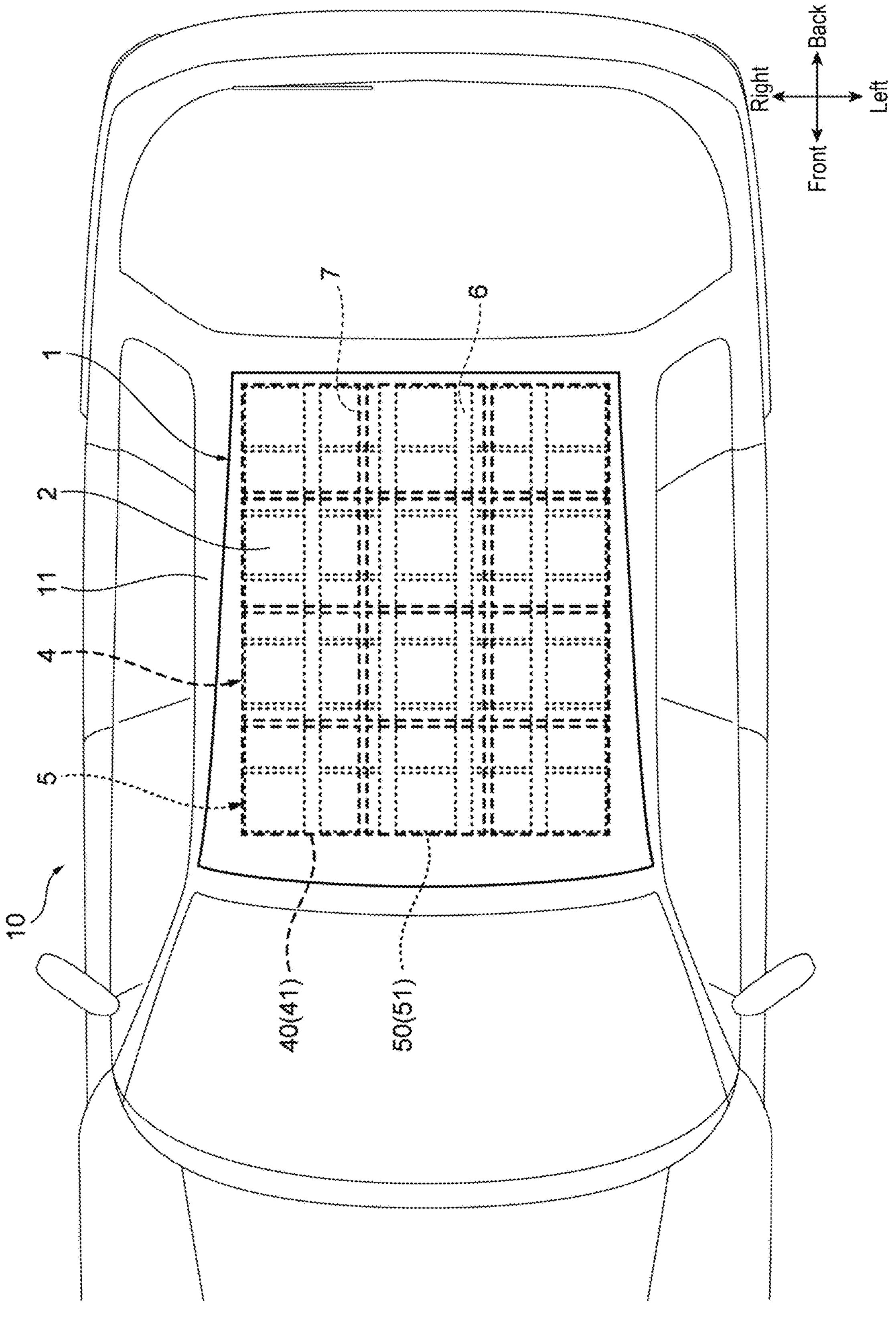
FIG. 1 is a plan view schematically showing a mounting example of a tandem solar cell according to one embodiment of the present disclosure.

FIG. 1 is a plan view schematically showing a mounting example of a tandem solar cell 1 (hereinafter, simply described as a solar cell 1 in some cases) according to the present embodiment, and specifically is a plan view schematically showing a state of the solar cell 1 according to the present embodiment being mounted on a roof substrate already mounted on a vehicle 10. The roof substrate having the solar cell 1 according to the present embodiment mounted thereon forms a roof 11 of the vehicle 10. The solar cell 1 has a curved plate shape, and thus can be mounted on the roof substrate so as to follow the shape of the roof substrate of the vehicle 10 similarly curved.

The solar cell 1 has a tandem structure including a translucent glass front surface layer 2 on an uppermost layer (that is, the layer on the very front as viewed in the orientation of FIG. 1) of the roof 11. When the solar cell 1 is irradiated with light such as sunlight, the irradiated light penetrates the front surface layer 2 and then reaches the inside of the solar cell 1. In this manner, an electromotive force is generated between the positive electrode and the negative electrode of the solar cell 1, so that the generated electric power can be supplied to the vehicle 10 or the like.

Note that the solar cell 1 is thin and lightweight. Taking advantage of such properties, the solar cell 1 can also be mounted on various objects such as a roof of a building other than the roof substrate of the vehicle 10 as illustrated in FIG. 1.

Figure 2:
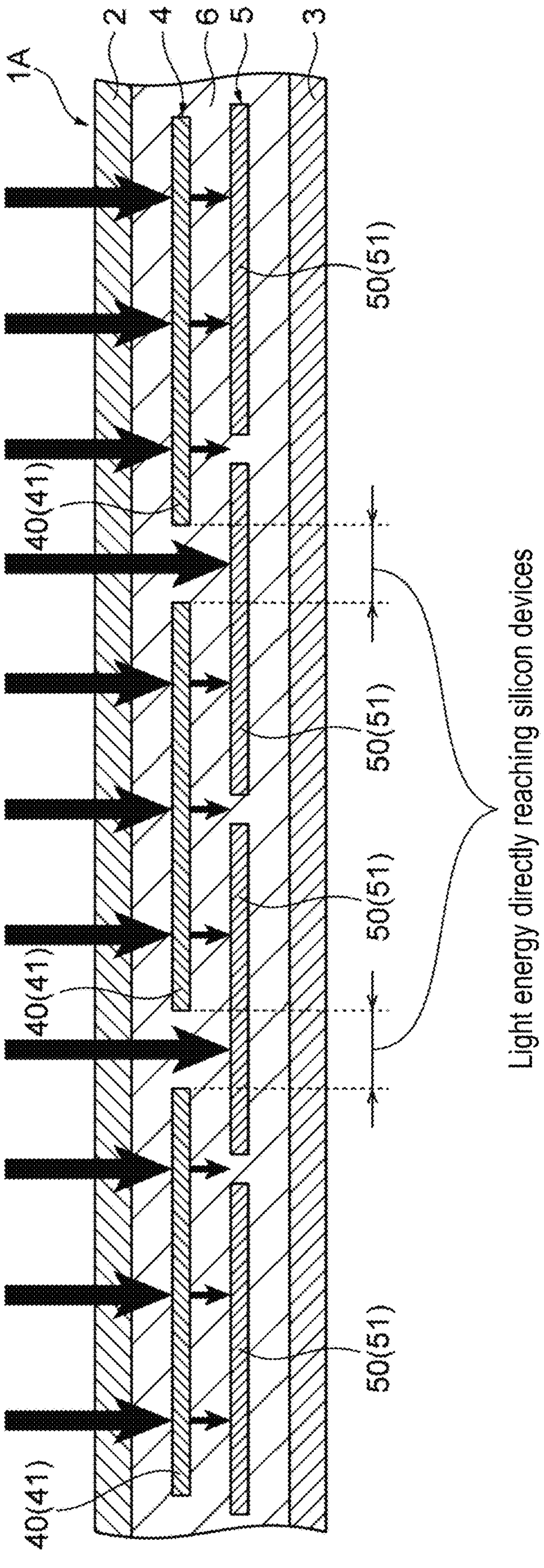
FIG. 2 is an enlarged cross-sectional view schematically showing a tandem solar cell according to a conventional technique, which does not include a translucent filter in a gap between perovskite devices.
Figure 3:
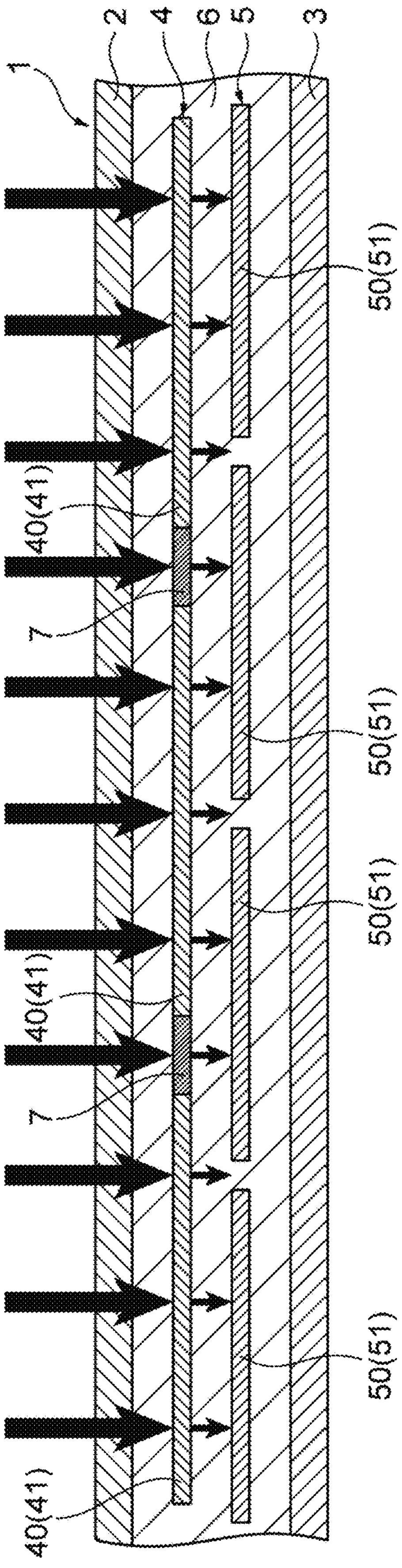
FIG. 3 is an enlarged cross-sectional view schematically showing the tandem solar cell including a translucent filter in a gap between perovskite devices according to the embodiment of the present disclosure.
Figure 4:
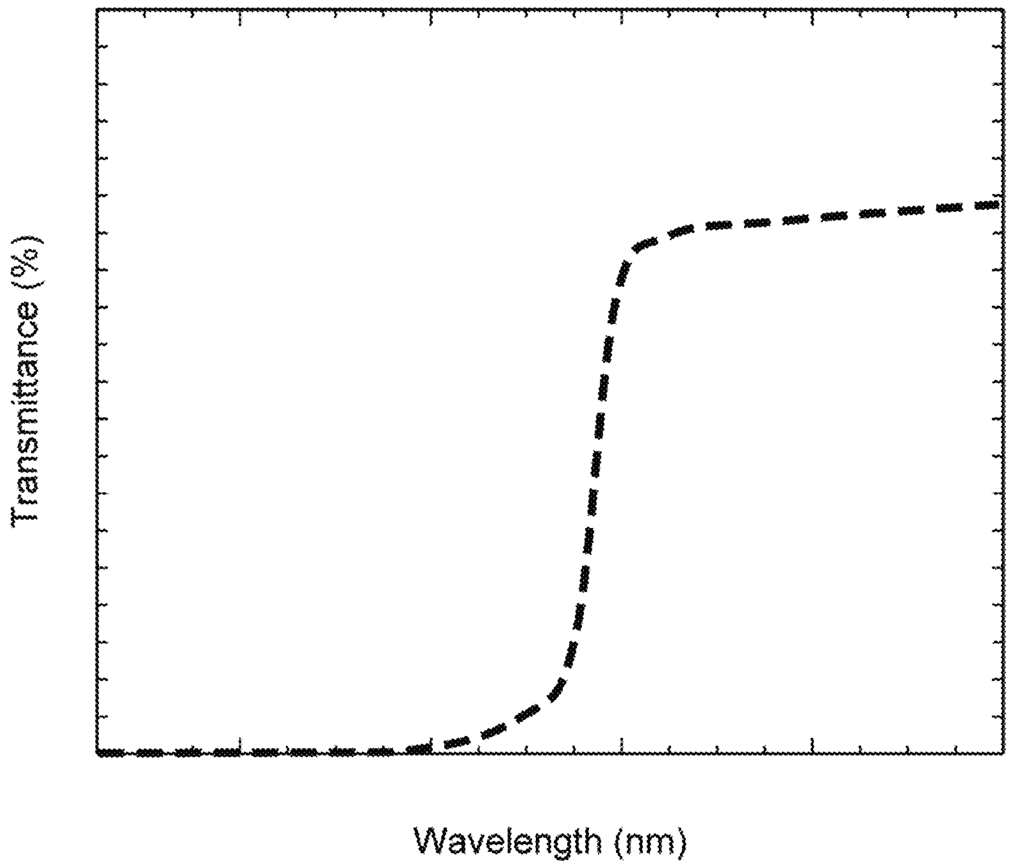
FIG. 4 is a chart showing a light transmittance of the perovskite device.
Figure 5:
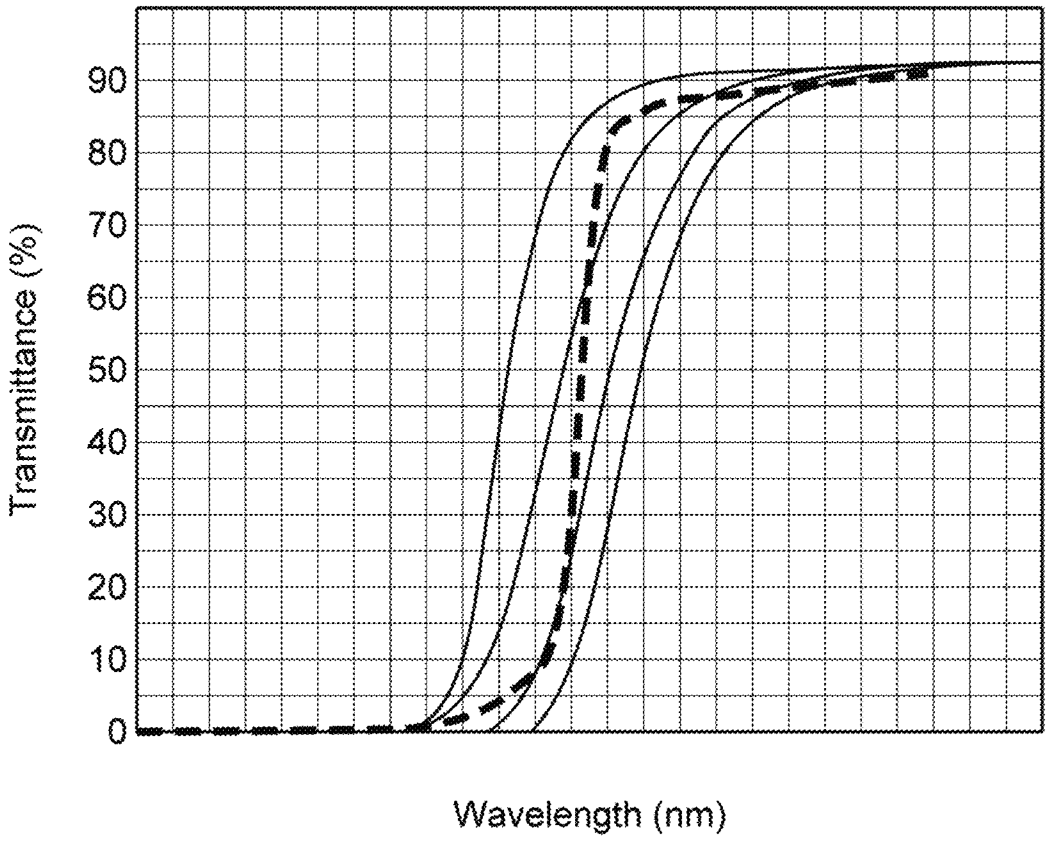
FIG. 5 is a chart showing light transmittance of various translucent filters, as well as light transmittance of the perovskite device.

FIG. 2 is an enlarged cross-sectional view schematically showing a tandem solar cell 1A (hereinafter, simply described as a solar cell 1A in some cases) according to a conventional technique. Further, FIG. 3 is an enlarged cross-sectional view schematically showing the tandem solar cell 1 according to the present embodiment. Note that the solar cell 1, 1A is for on-vehicle use and is curved so as to follow the shape of the roof substrate of the vehicle 10, but the cross-sectional view shows it in a flat plate shape, for a matter of convenience.

The solar cell 1, 1A includes the front surface layer 2, a back surface layer 3, and between the front surface layer 2 and the back surface layer 3, a perovskite solar cell (unit) 4 and a silicon solar cell (unit) 5 that are sequentially disposed from the front surface layer 2 side, a sealing member (also referred to as an intermediate layer or the like) 6 that seals the perovskite solar cell 4 and the silicon solar cell 5, and the like. The back surface layer 3 is also made of glass as with the front surface layer 2. In other words, in the solar cell 1, 1A, between the front surface layer 2 and the back surface layer 3, the perovskite solar cell 4 is stacked on the front surface layer 2 side (upper side) of the silicon solar cell 5 and these stacked layers are sealed and bonded together with the sealing member 6.

The perovskite solar cell 4 includes a plurality of substantially rectangular perovskite cells 40 (12 of those including 3 in the left-right direction and 4 in the front-back direction in the example of FIG. 1) which is disposed in a matrix with a slight distance from one another in a plan view. Each perovskite cell 40 includes a perovskite device 41, an electrode, and the like and is curved so as to follow the curved shape of the solar cell 1, 1A. The perovskite device 41 is a flexible power-generating device including perovskite as a raw material.

The silicon solar cell 5 includes a plurality of substantially rectangular silicon cells 50 (35 of those including 5 in the left-right direction and 7 in the front-back direction in the example of FIG. 1) which is disposed in a matrix with a slight distance from one another in a plan view so as to oppose the plurality of perovskite cells 40 in the up-down direction. Each silicon cell 50 includes a silicon device 51, an electrode, and the like and is curved so as to follow the curved shape of the solar cell 1, 1A. The silicon device 51 is also one type of power-generating devices and may be either a single crystal or a polycrystal.

As described above, the irradiated light after permeating the front surface layer 2 reaches the inside of the solar cell 1, 1A. The irradiated light, upon reaching the perovskite devices 41 first, is either absorbed in the perovskite devices 41 or penetrates the perovskite devices 41 to be absorbed in the silicon devices 51 depending on the wavelength band of the irradiated light. Specifically, light in a wavelength band shorter than a predetermined value, such as a visible ray, is absorbed in the perovskite devices 41, while light in a wavelength band longer than a predetermined value, such as an infrared ray, penetrates the perovskite devices 41 to be absorbed in the silicon devices 51. That is, by stacking the power-generating devices absorbing light in different wavelengths, the light in a wide spectral range of wavelengths can be absorbed to generate power, so that the energy of the irradiated light can be highly efficiently converted into an electrical energy.

The perovskite devices 41 and the silicon devices 51 are separately, electrically connected via interconnectors (not shown), and the electric current flows through the perovskite solar cell 4 and the silicon solar cell 5 via the interconnectors. Specifically, the perovskite devices 41 and the silicon devices 51 are separately or independently, electrically connected via the interconnectors, and the perovskite devices 41 (perovskite solar cell 4) and the silicon devices 51 (silicon solar cell 5) are not electrically connected. Such a solar cell 1, 1A that extracts the generated electric power separately from the perovskite solar cell 4 as a top cell and the silicon solar cell 5 as a bottom cell is referred to as a four-terminal tandem solar cell.

The cell sizes (areas in a plan view) of the perovskite device 41 forming the top cell and the silicon device 51 forming the bottom cell are different. Specifically, the cell size (area in the plan view) of the perovskite device 41 is larger than that of the silicon device 51. Accordingly, the number of cells of the perovskite devices 41 that can be disposed is fewer than that of the silicon devices 51. In the example of FIG. 1, a total of 12 perovskite devices 41 including 3 in the left-right direction (vehicle width direction) and 4 in the front-back direction (vehicle length direction) are disposed with a predetermined distance from one another. Further, a total of 35 silicon devices 51 including 5 in the left-right direction (vehicle width direction) and 7 in the front-back direction (vehicle length direction) are disposed with a predetermined distance from one another. When the silicon solar cell 5 and the perovskite solar cell 4 having different cell sizes are used in tandem, the numbers and positions of the upper and lower solar cells that can be disposed (specifically, the silicon devices 51 forming the bottom cell and the perovskite devices 41 forming the top cell) differ, which could cause the silicon devices 51 to be partially or entirely disposed on the back surface layer 3 side (lower side) of the gaps between the perovskite devices 41. In the example of FIG. 1, in 12 silicon devices 51, each silicon device 51 is entirely disposed on the lower side of the perovskite device 41, while in 23 silicon devices 51, each silicon device 51 is partially (or entirely) disposed on the lower side of the gap between the perovskite devices 41.

When the silicon solar cell 5 (silicon devices 51 thereof) and the perovskite solar cell 4 (perovskite devices 41 thereof) are used in tandem (stacked), light remaining after part of light energy is absorbed in the perovskite solar cell 4 reaches the silicon devices 51 forming the bottom cell, and the silicon devices 51 generate electric power using the remaining light. Meanwhile, in the gaps between the perovskite devices 41, the light energy is not absorbed in the perovskite solar cell 4 and thus directly reaches the silicon devices 51. When intense light that passes through the gaps between the perovskite devices 41 (from the upper side toward the lower side) without penetrating the perovskite devices 41 reaches the silicon devices 51 disposed on the lower side of the gaps between the perovskite devices 41, heat generation due to non-uniform electric power generation (occurrence of uneven power generation) among the silicon devices is concerned. Because of the temperature characteristics of the solar cell, when the temperature rises due to heat generation, the power generation efficiency of the solar cell decreases (see, in particular, FIG. 2).

Thus, in the solar cell 1 according to the present embodiment, a translucent filter 7 that absorbs (blocks) part of light energy is disposed in the gap between the perovskite devices 41, more specifically, in the gap between the perovskite devices 41, on the lower side of which the silicon device 51 is disposed (see, in particular, FIG. 3). Specifically, the translucent filter 7 is formed of a filter (filter corresponding to the dotted line of FIG. 5) that blocks light in a wavelength band (see the dotted line of FIG. 4) absorbed in the perovskite devices 41. The translucent filter 7 may be flexible as with the perovskite device 41. In this manner, in the gap between the perovskite devices 41, the light permeating the translucent filter 7 provided in the gap, of which the wavelength to be absorbed in the perovskite devices 41 has been blocked, reaches the silicon devices 51 on the lower side.

As described above, the tandem solar cell 1 according to the present embodiment is the tandem solar cell 1 in which the plurality of perovskite devices 41 is disposed on the front surface side (front surface layer 2 side) of the plurality of silicon devices 51 and at least part of the plurality of silicon devices 51 is disposed on the back surface side (back surface layer 3 side) of the gap between the perovskite devices 41 or light passing through the gap between the perovskite devices 41 from the front surface side (front surface layer 2 side) to the back surface side (back surface layer 3 side) reaches the at least part of the plurality of silicon devices 51, and the translucent filter 7 that blocks light in the wavelength band absorbed in the perovskite devices 41 is provided in the gap between the perovskite devices 41.

According to the present embodiment, by providing the translucent filter 7 that blocks light in the wavelength band absorbed in the perovskite devices 41 in the gap between the perovskite devices 41, uneven power generation (non-uniform power generation) among the silicon devices 51 disposed on the lower side of the perovskite devices 41 can be suppressed. As a result, a reduction in the power generation efficiency of the tandem solar cell 1 can be suppressed.

Note that in the aforementioned embodiment, in some of the silicon devices 51 (12 of those), each silicon device 51 is entirely disposed on the lower side of the perovskite device 41 while in some of the silicon devices 51 (23 of those), each silicon device 51 is partially (or entirely) disposed on the lower side of the gap between the perovskite devices 41. However, for example, even in a case where every silicon device 51 is partially or entirely disposed on the lower side of the gap between the perovskite devices 41, the translucent filter 7 is provided in the gap between the perovskite devices 41 as in the aforementioned embodiment because of uneven power generation among the silicon devices 51 due to variations in area among the silicon devices 51 overlapping (below) the gaps between the perovskite devices 41 so that uneven power generation among the silicon devices 51 can be suppressed.

Note that the present disclosure is not limited to the aforementioned embodiment, and can be modified and changed, as appropriate, within the range without departing from the aim of the present disclosure.

DESCRIPTION OF SYMBOLS

1 Tandem solar cell
2 Front surface layer
3 Back surface layer
4 Perovskite solar cell
40 Perovskite cell
41 Perovskite device
5 Silicon solar cell
50 Silicon cell
51 Silicon device
6 Sealing member
7 Translucent filter
10 Vehicle
11 Roof

What is claimed is:

1. A tandem solar cell comprising a plurality of perovskite devices disposed on a front surface side a plurality of silicon devices, at least part of the plurality of silicon devices being disposed on a back surface side of a gap between the perovskite devices that are arranged laterally or light passing through the gap between the perovskite devices from the front surface side to the back surface side reaching the at least part of the plurality of silicon devices, wherein a translucent filter that b s light in a wavelength band absorbed in the perovskite devices is provided in the gap, which is a lateral gap between adjacent ones of the perovskite devices that are arranged laterally.

2. The tandem solar cell according to claim 1, wherein an area of each perovskite device is larger than an area of each silicon device.

* * * * *